(12) United States Patent
Hashimoto et al.

(10) Patent No.: US 9,653,138 B1
(45) Date of Patent: May 16, 2017

(54) MAGNETIC MEMORY AND METHOD OF WRITING DATA

(71) Applicant: KABUSHIKI KAISHA TOSHIBA, Minato-ku, Tokyo (JP)

(72) Inventors: Yutaka Hashimoto, Seoul (KR); Katsuya Nishiyama, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/264,539

(22) Filed: Sep. 13, 2016

Related U.S. Application Data

(60) Provisional application No. 62/302,461, filed on Mar. 2, 2016.

(51) Int. Cl.
*G11C 11/00* (2006.01)
*G11C 11/16* (2006.01)

(52) U.S. Cl.
CPC ........ *G11C 11/1675* (2013.01); *G11C 11/161* (2013.01); *G11C 11/1673* (2013.01); *G11C 11/1677* (2013.01)

(58) Field of Classification Search
CPC .............. G11C 11/1675; G11C 11/161; G11C 11/1673; G11C 11/1677
USPC ......................................................... 365/158
See application file for complete search history.

(56) References Cited

U.S. PATENT DOCUMENTS

| 7,414,881 | B2 * | 8/2008 | Sugibayashi | .......... B82Y 25/00 |
| | | | | 257/E43.004 |
| 8,374,048 | B2 | 2/2013 | Apalkov | |
| 8,520,433 | B1 * | 8/2013 | Kato | ..................... G11C 11/161 |
| | | | | 365/148 |
| 8,680,633 | B1 * | 3/2014 | Kato | ...................... H01L 43/08 |
| | | | | 257/421 |
| 8,836,061 | B2 * | 9/2014 | Zhou | ...................... H01L 43/10 |
| | | | | 257/421 |
| 2014/0284741 | A1 | 9/2014 | Higo et al. | |

FOREIGN PATENT DOCUMENTS

WO    2010100678 A1    9/2010

\* cited by examiner

*Primary Examiner* — Pho M Luu
(74) *Attorney, Agent, or Firm* — Holtz, Holtz & Volek PC

(57) ABSTRACT

A memory includes a first magnetic layer, a second magnetic layer, a nonmagnetic layer between the first and second magnetic layers, a third magnetic layer synthetic-antiferro-magnetic-coupled with the second magnetic layer, and a controller controlling a read operation and a write operation. The write operation includes a first operation, a second operation and a third operation. A first potential of the first magnetic layer is larger than a second potential of the third magnetic layer in the first operation. A third potential of the third magnetic layer is larger than a fourth potential of the first magnetic layer in the second operation. A fifth potential of the first magnetic layer is larger than a sixth potential of the third magnetic layer in the third operation.

20 Claims, 19 Drawing Sheets

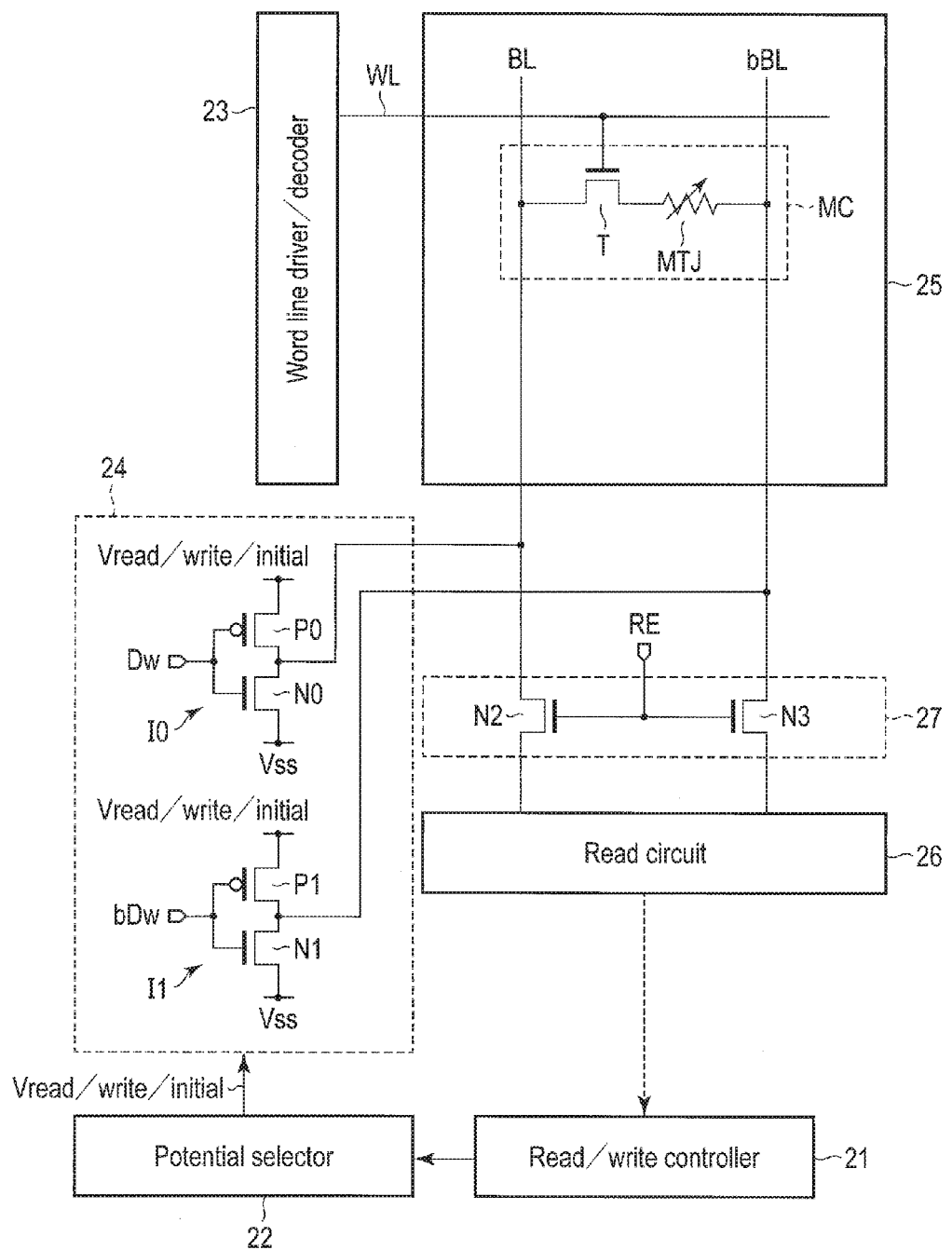
F I G. 3

| Operation mode | Dw | bDw | Vread/write/initial |
|---|---|---|---|
| AP-write | 1 | 0 | Vp-ap |
| P-write | 0 | 1 | Vap-p |
| RL-initialization | 0 | 1 | Vinitial |
| Read | 0 | 1 | Vread |

0 → Low level potential
1 → High level potential

F I G. 4

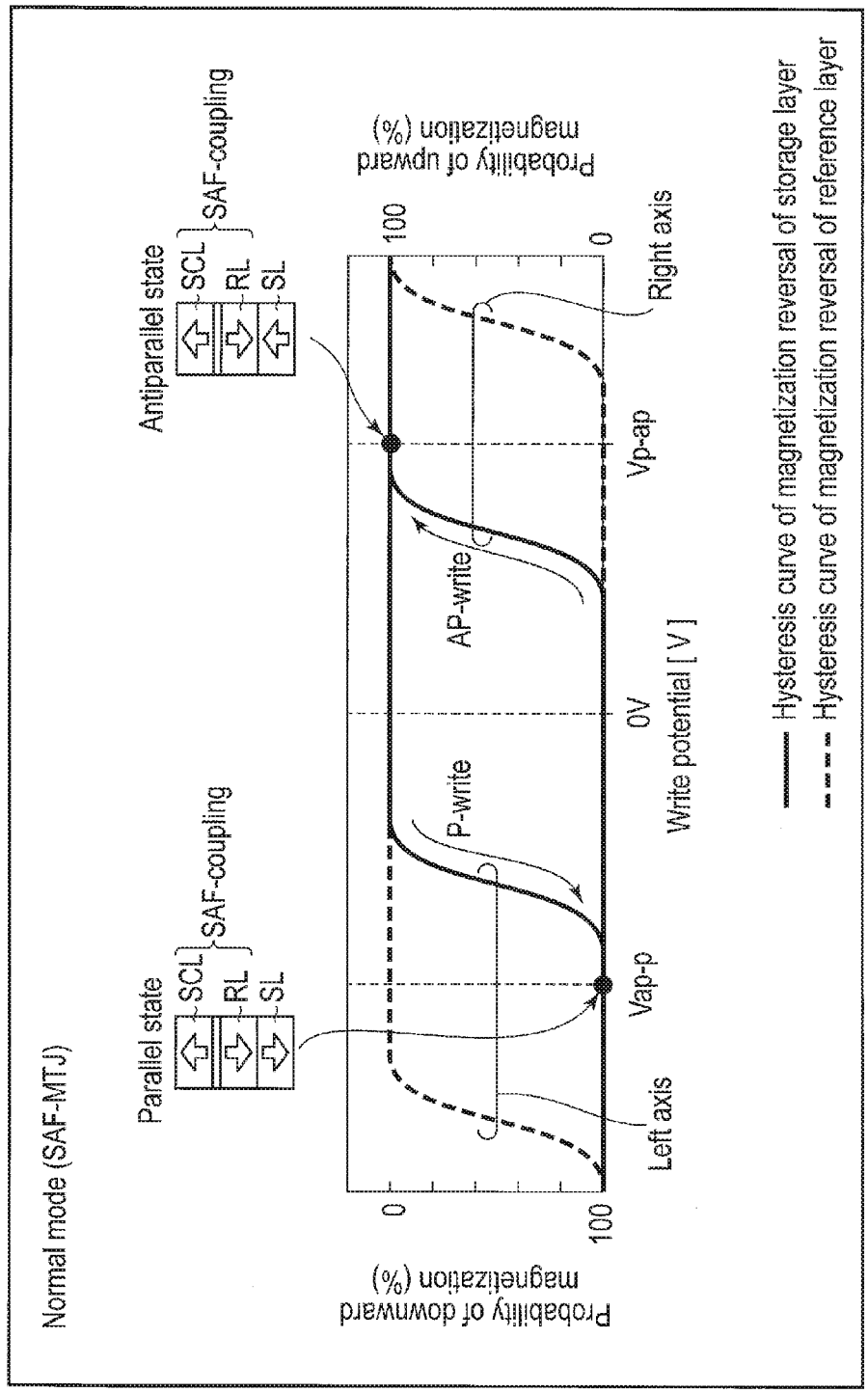
F I G. 7

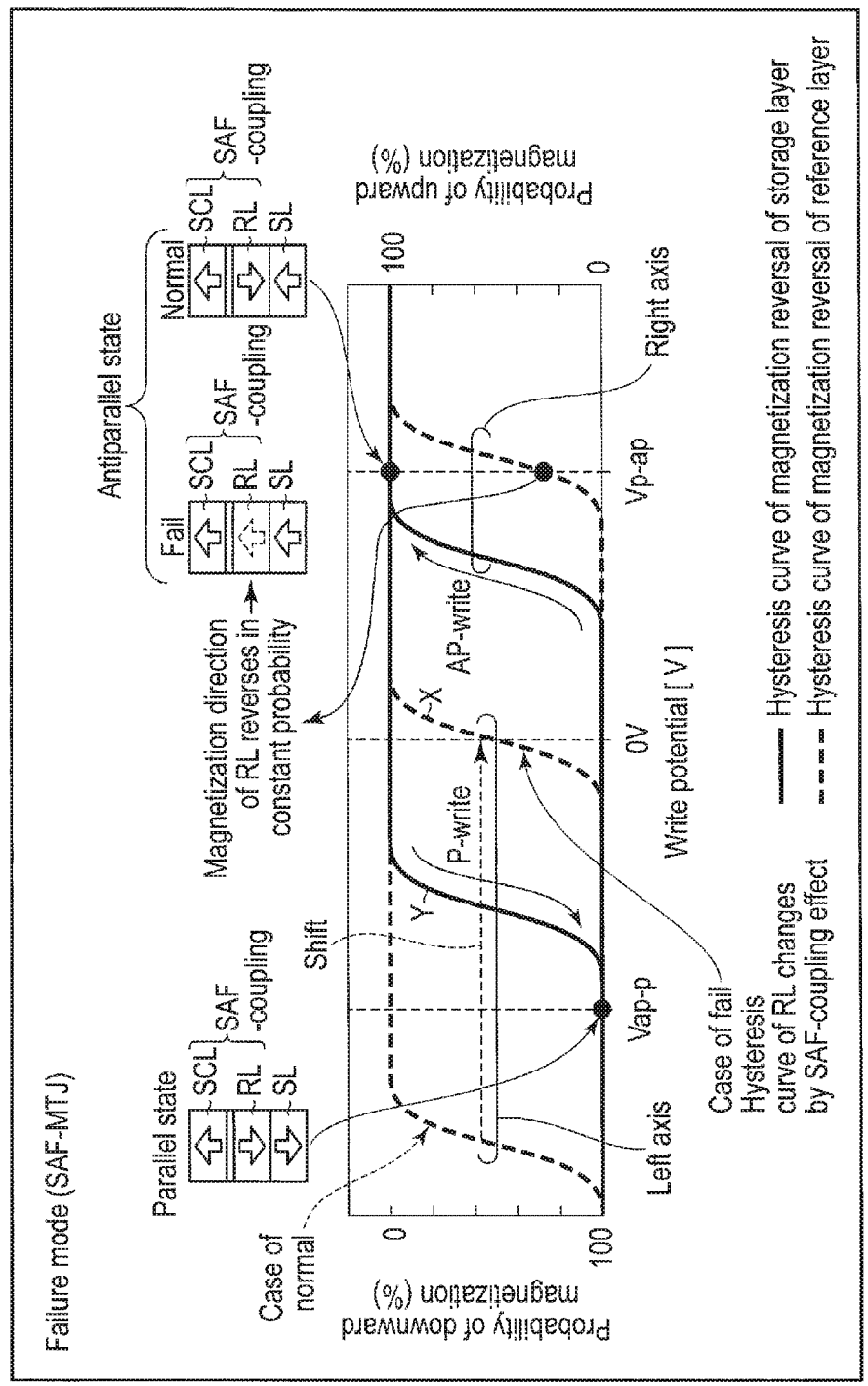
F I G. 8

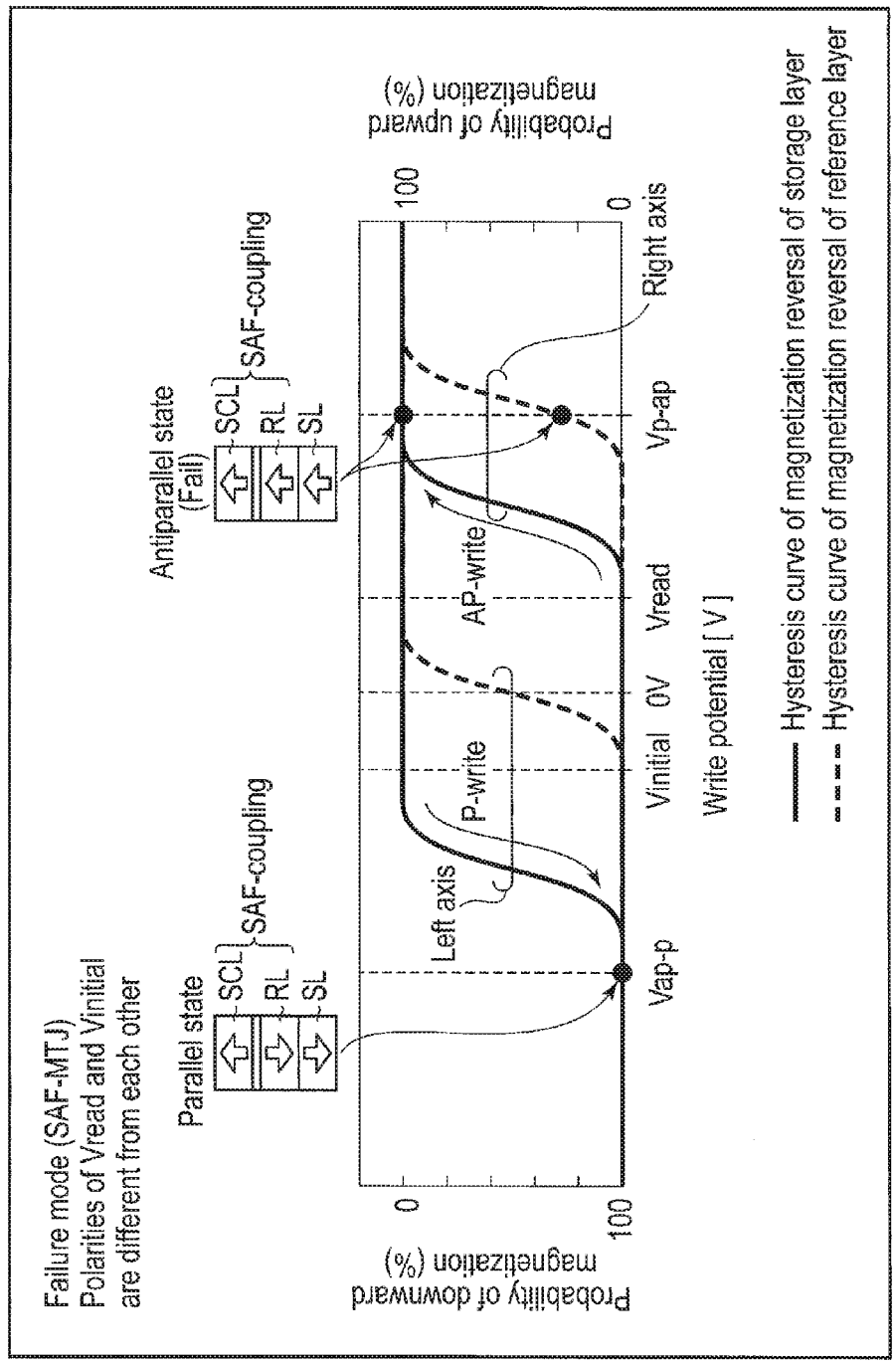
F I G. 13

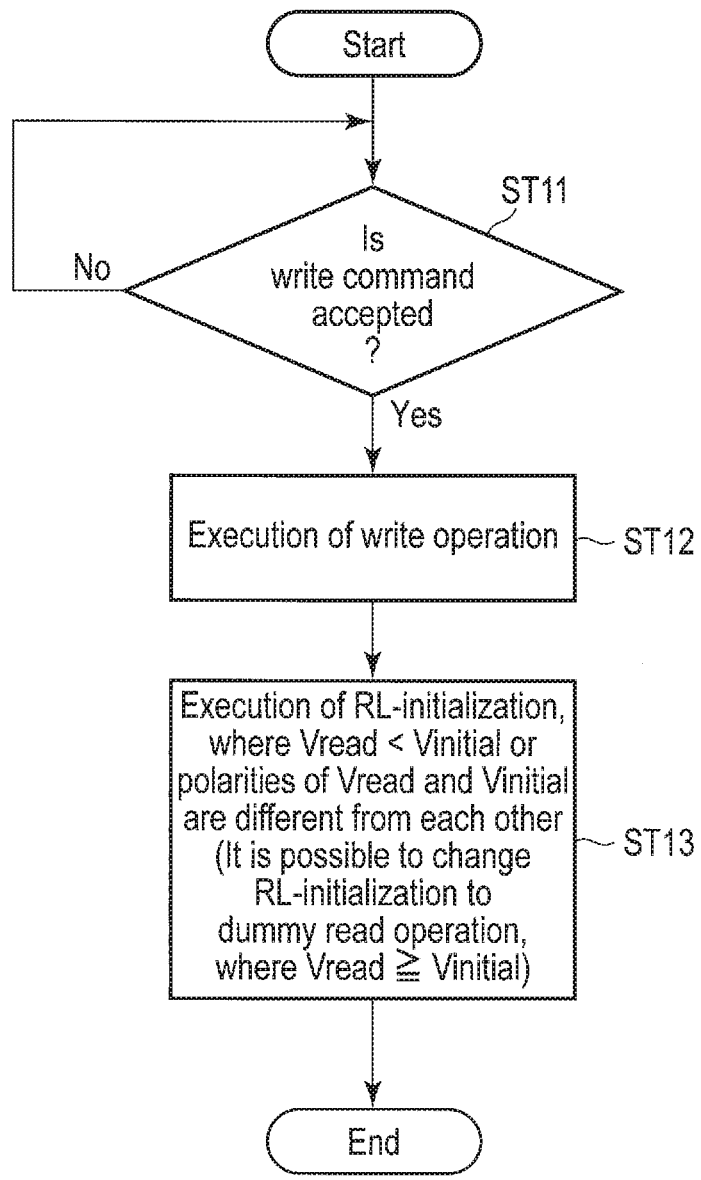
F I G. 14

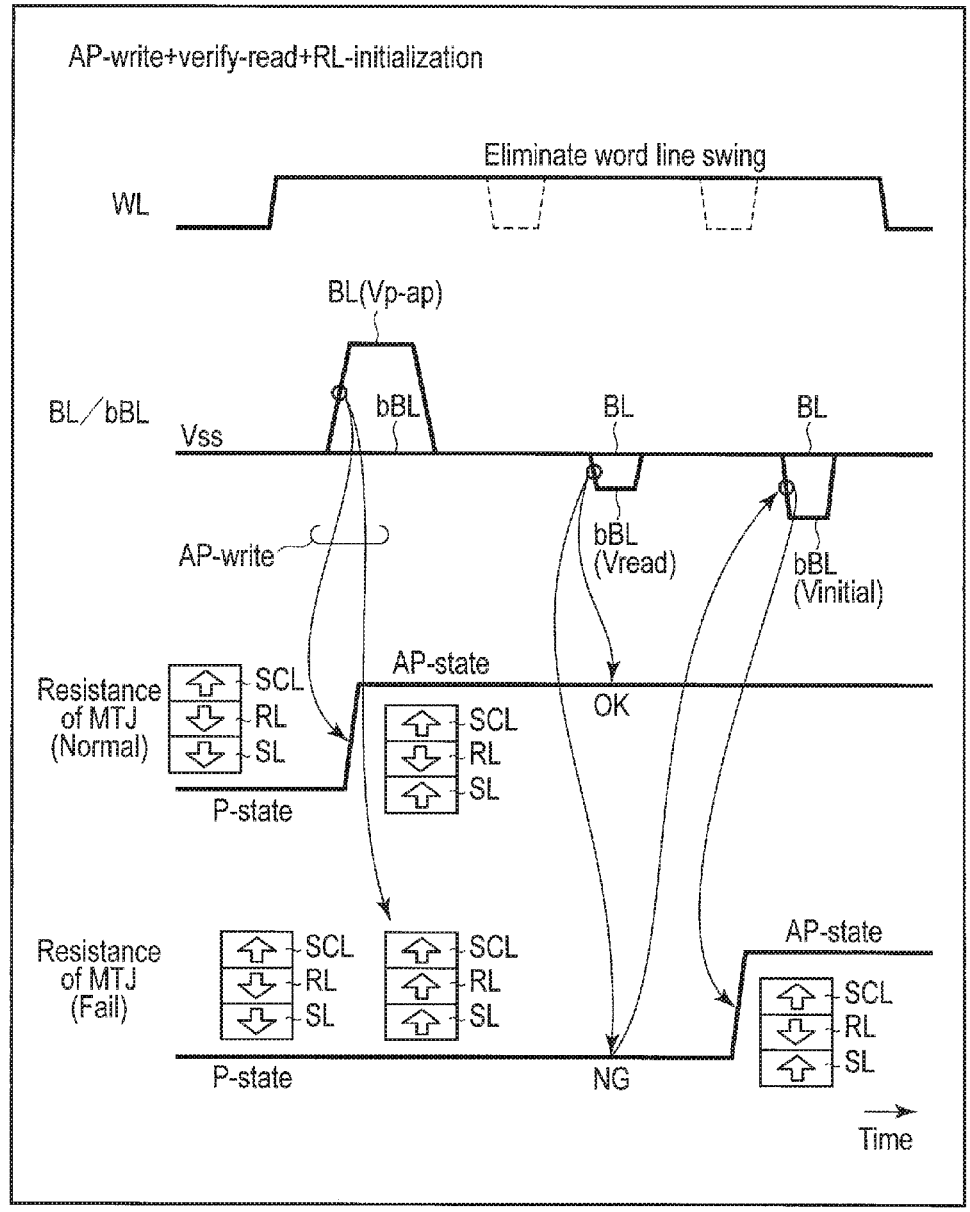
F I G. 17

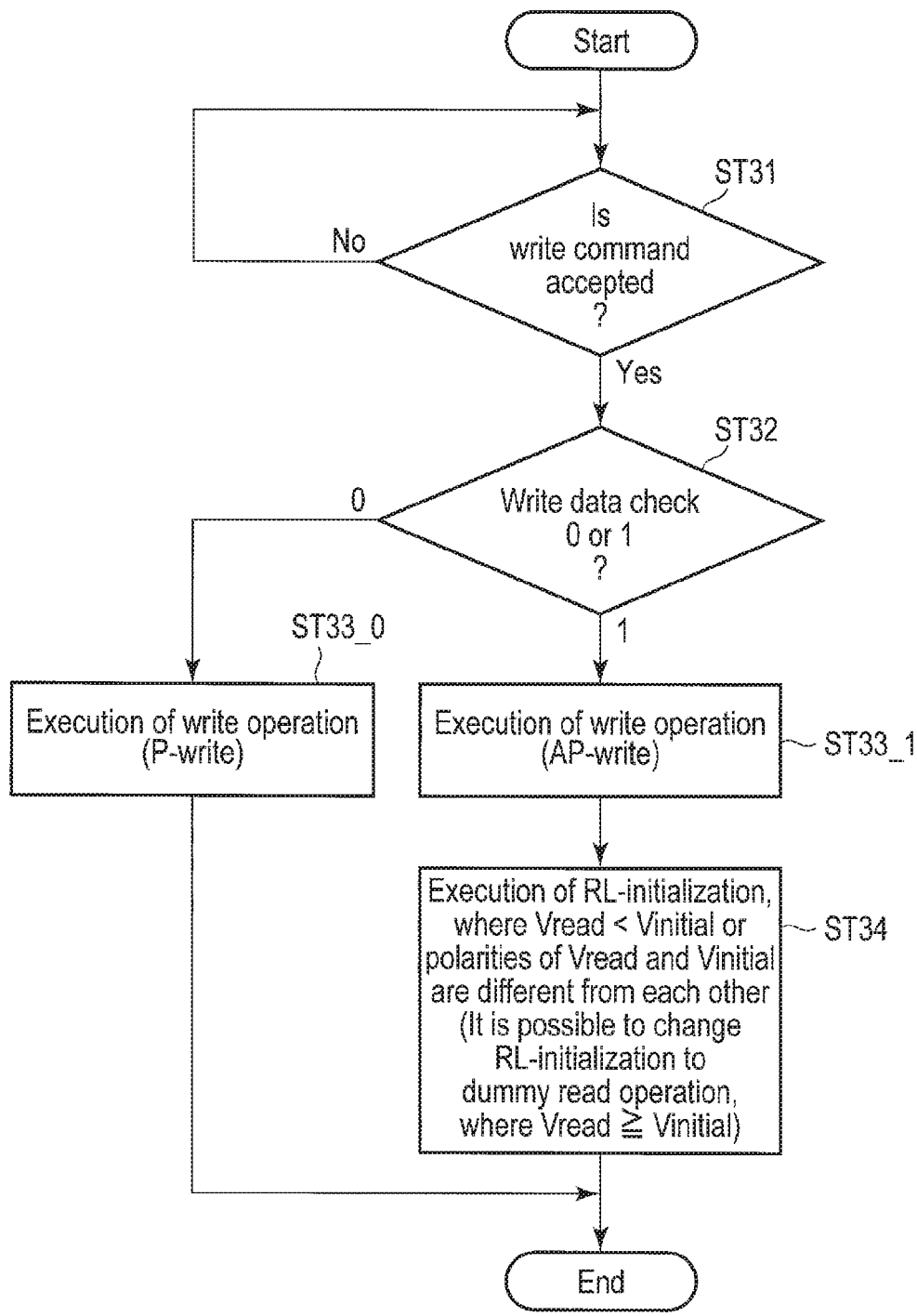
F I G. 19

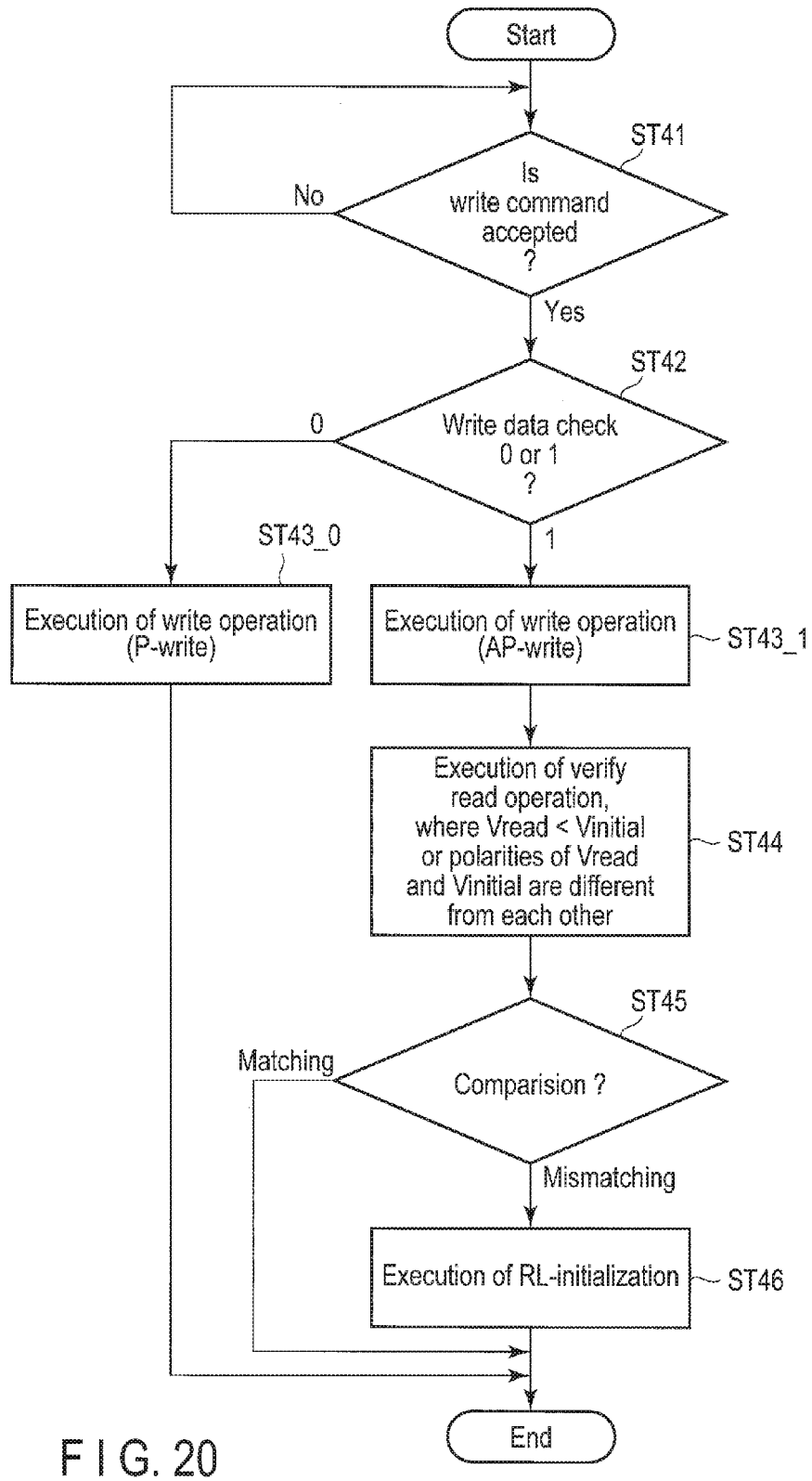
F I G. 20

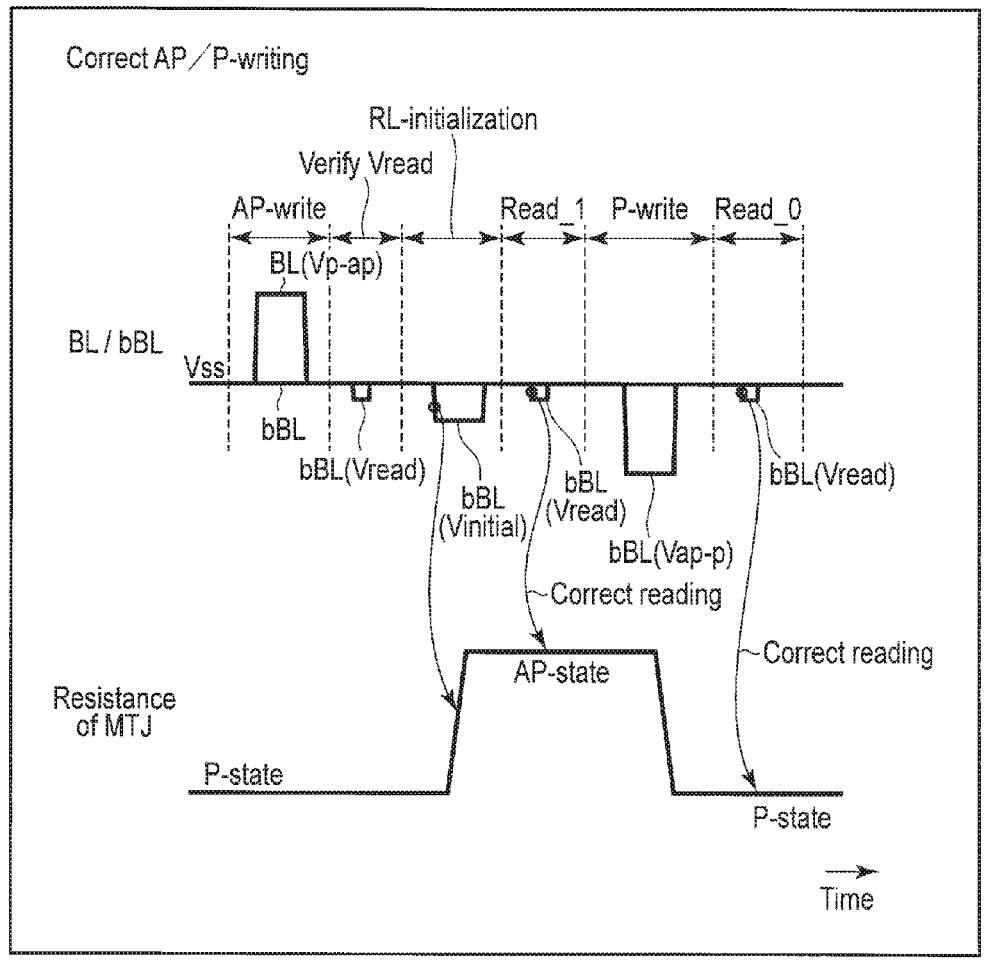
F I G. 21

MAGNETIC MEMORY AND METHOD OF WRITING DATA

CROSS-REFERENCE TO RELATED APPLICATIONS

This application claims the benefit of U.S. Provisional Application No. 62/302,461, filed Mar. 2, 2016, the entire contents of which are incorporated herein by reference.

FIELD

Embodiments described herein relate generally to a magnetic memory and a method of writing data.

BACKGROUND

The basic structure of a memory cell of a magnetic memory, for example, a magnetoresistive random-access memory (MRAM), consists of a storage layer (magnetic layer), a reference layer (magnetic layer), and a nonmagnetic layer between the storage and reference layers. The reference layer comprises a material or a structure in which the magnetization direction is difficult to reverse in comparison with the storage layer. However, the magnetization direction of the reference layer may be reversed at the time of a write operation because of manufacturing tolerances.

BRIEF DESCRIPTION OF THE DRAWINGS

FIG. 3 shows the main part of the magnetic memory of FIG. 2.
FIG. 4 shows the relationships of the operation mode, input signals and the potential applied to bit lines.
FIG. 7 to FIG. 13 show the hysteresis curves of magnetization reversal of a storage layer and a reference layer.
FIG. 14 shows the first example of a write operation.
FIG. 17 shows the relationship between an AP-write and an RL-initialization.
FIG. 19 shows the third example of a write operation.
FIG. 20 shows the fourth example of a write operation.
FIG. 21 shows the relationship between a write operation and a read operation.

DETAILED DESCRIPTION

In general, according to one embodiment, a magnetic memory comprises: a first magnetic layer; a second magnetic layer; a nonmagnetic layer between the first and second magnetic layers; a third magnetic layer synthetic-antiferromagnetic-coupled with the second magnetic layer; a first conductive line connected to the first magnetic layer; a second conductive line connected to the third magnetic layer; and a controller controlling a read operation and a write operation, the write operation including a first operation, a second operation and a third operation, a first potential of the first conductive line being larger than a second potential of the second conductive line in the first operation, a third potential of the second conductive line being larger than a fourth potential of the first conductive line in the second operation, a fifth potential of the first conductive line being larger than a sixth potential of the second conductive line in the third operation, a first difference between the fifth and sixth potentials being smaller than a second difference between the first and second potentials, and the third operation being executed after the second operation and before the read operation.

Embodiments will be described hereinafter with reference to the accompanying drawings.

Embodiments

Figure 1:
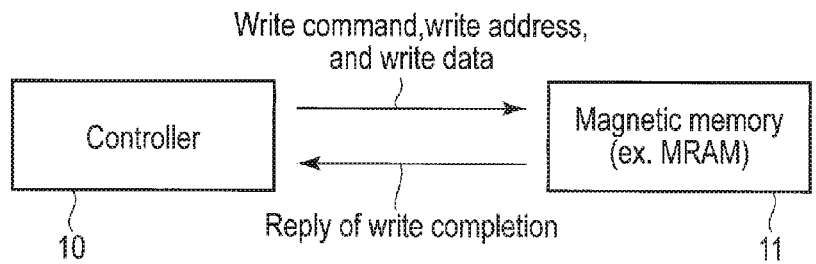
FIG. 1 shows an example of a memory system.

FIG. 1 shows an example of a memory system.

A memory system to which the present embodiment can be applied comprises a controller 10 and a magnetic memory (for example, an MRAM) 11 controlled by the controller 10. The controller 10 is, for example, a host CPU or a memory controller. The controller 10 and the magnetic memory 11 may be separate chips, or may be included in a chip of a processor, etc.

When data is written to the magnetic memory 11, the controller 10 issues a write command and transfers it to the magnetic memory 11. The controller 10 transfers a write address and write data to the magnetic memory 11. The magnetic memory 11 transfers a reply of write completion to the controller 10 after accepting the write command.

Figure 2:
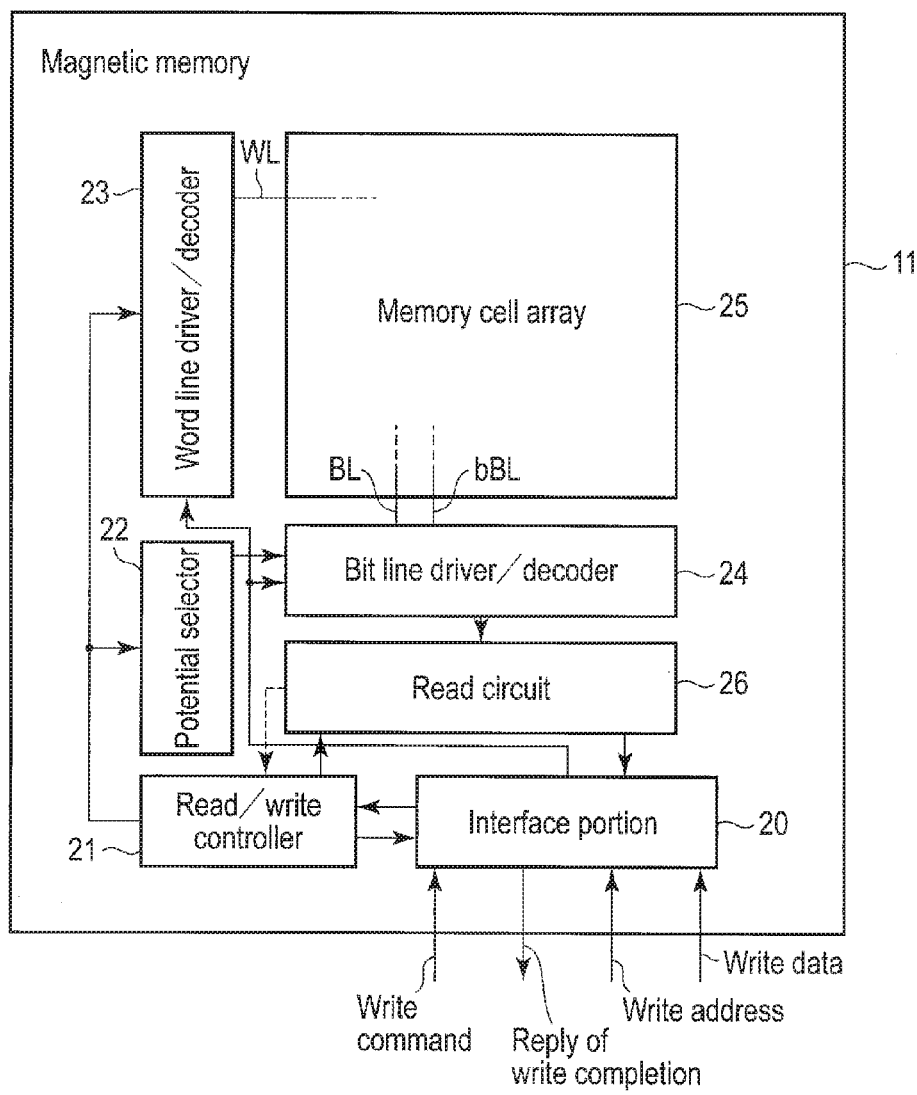
FIG. 2 shows an example of a magnetic memory.

FIG. 2 shows an example of the magnetic memory.

The magnetic memory 11 is, for example, an MRAM. The magnetic memory 11 comprises an interface portion 20, a read/write controller 21, a potential selector 22, a word line driver/decoder 23, a bit line driver/decoder 24, a memory cell array 25 and a read circuit 26.

After accepting a write command, the interface portion 20 notifies the read/write controller 21 of the acceptance of the write command. The interface portion 20 transfers a write address to the word line driver/decoder 23 and the bit line driver/decoder 24, and transfers write data to the bit line driver/decoder 24.

The read/write controller 21 controls a read operation and a write operation.

A read operation is an operation of accessing the memory cell array 25 and outputting data read from the memory cell array 25 to the outside of the magnetic memory 11. In a read operation, the read circuit 26 is activated. In the present embodiment, a read operation does not include a verify read operation (described later) for verifying whether or not a write operation has been performed correctly.

A write operation is an operation of accessing the memory cell array 25 and writing write data to the memory cell array 25. When a verify read operation is performed in a write operation, the read circuit 26 is activated temporarily. Data which is read from the memory cell array 25 in a verify read operation is not output to the outside of the magnetic memory 11 and is transferred to the read/write controller 21 (see the dotted arrow).

When the read/write controller 21 determines that a write operation has been completed, the read/write controller 21 notifies the interface portion 20 of the completion of the write operation. The interface portion 20 outputs a reply of write completion to the outside of the magnetic memory 11.

In a read/write operation, the potential selector 22 selects the potential to be applied to bit lines BL and bBL from a plurality of potentials based on, for example, a select signal from the read/write controller 21. The selected potential is transferred to the bit line driver/decoder 24.

The word line driver/decoder 23 selects, for example, a word line WL from a plurality of word lines. The bit line driver/decoder selects, for example, a pair of bit lines BL and bBL from a plurality of pairs of bit lines. The word line driver/decoder 23 and the bit line driver/decoder 24 function as an access circuit which is allowed to access the memory cell array 25 in a read/write operation.

FIG. 3 shows the main part of the magnetic memory of FIG. 2. FIG. 4 shows the relationships of the operation mode, input signals Dw and bDw, and the potential Vread/write/initial applied to bit lines in the magnetic memory of FIG. 3.

The memory cell array 25 comprises a select transistor (for example, a field-effect transistor [FET]) T and a magnetoresistive element MTJ connected in series. For example, the control terminal (gate) of the select transistor is connected to a word line WL. One of two current terminals of the select transistor T is connected to bit line BL. The magnetoresistive element MTJ is a two-terminal element. One end of the magnetoresistive element MTJ is connected to the other one of the two current terminals of the select transistor T. The other end of the magnetoresistive element MTJ is connected to bit line bBL.

The bit line driver/decoder 24 comprises inverter circuit (driver) I0 connected to bit line BL, and inverter circuit (driver) I1 connected to bit line bBL. Inverter circuit I0 comprises P-channel transistor (FET) P0 and N-channel transistor (FET) N0 connected in series between first and second supply terminals. Inverter circuit I1 comprises P-channel transistor (FET) P1 and N-channel transistor (FET) N1 connected in series between first and second supply terminals.

Inverter I0 drives bit line BL based on input signal Dw. Inverter I1 drives bit line bBL based on input signal bDw. Both of input signals Dw and bDw are binary signals (in other words, a signal having one of a low level and a high level). Input signal bDw is defined as the inversion signal of input signal Dw.

The first supply terminals of inverter circuits I0 and I1 are set to Vread/write/initial. The second supply terminals of inverter circuits I0 and I1 are set to Vss. For example, Vss is a ground potential. Vread/write/initial is a positive potential greater than Vss. Vread/write/initial is the potential selected by the potential selector 22.

Figure 5:
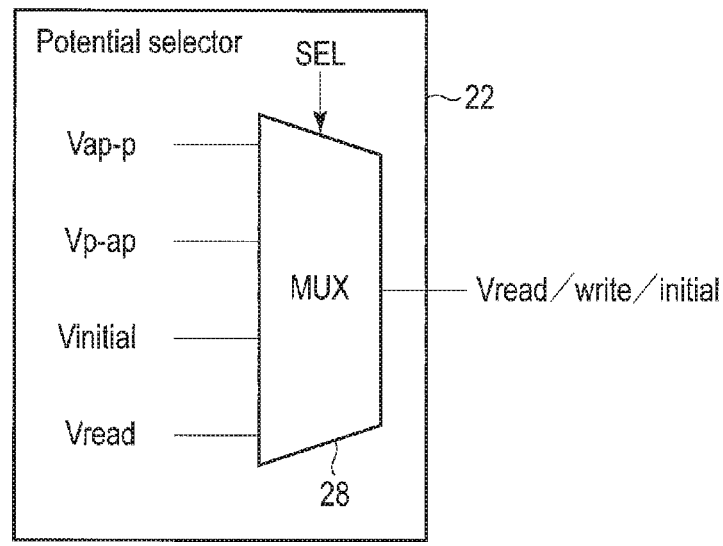
FIG. 5 shows an example of a potential selector.

For example, the potential selector 22 comprises a multiplexer (MUX) 28 as shown in FIG. 5. For example, the multiplexer 28 selects one of four potentials Vap-p, Vp-ap, Vinitial and Vread based on a select signal SEL.

Vap-p and Vp-ap are potentials used in a write operation. Vap-p is a potential used to change the state of the magnetoresistive element MTJ from an antiparallel state to a parallel state. Vp-ap is a potential used to change the state of the magnetoresistive element MTJ from a parallel state to an antiparallel state.

The magnetoresistive element MTJ comprises a storage layer (magnetic layer), a reference layer (magnetic layer), and a nonmagnetic layer between the storage and reference layers. The reference layer comprises a material or a structure in which the magnetization direction is difficult to reverse in comparison with the storage layer. In this case, a parallel state indicates that the magnetization directions of the storage and reference layers are the same as each other. An antiparallel state indicates that the magnetization directions of the storage and reference layers are opposite to each other.

In a parallel state, for example, the resistance of the magnetoresistive element MTJ is small. This state is called a 0-state, in which data 0 is stored. In an antiparallel state, for example, the resistance of the magnetoresistive element MTJ is large. This state is called a 1-state, in which data 1 is stored.

If the write data is 0 (P-write) in a write operation, for example, the potential selector 22 selects Vap-p, and Vread/write/initial is set to Vap-p. Input signal Dw is set to 0 (low level). Input signal bDw is set to 1 (high level). Thus, Vap-p is applied to bit line BL. Vss is applied to bit line bBL. In this manner, a write current from bit line BL to bit line bBL flows in the magnetoresistive element MTJ. The magnetoresistive element MTJ is transitioned from an antiparallel state to a parallel state.

If the write data is 1 (AP-write) in a write operation, for example, the potential selector 22 selects Vp-ap, and Vread/write/initial is set to Vp-ap. Input signal Dw is set to 1 (high level). Input signal bDw is set to 0 (low level). Thus, Vp-ap is applied to bit line bBL. Vss is applied to bit line BL. In this manner, a write current from bit line bBL to bit line BL flows in the magnetoresistive element MTJ. The magnetoresistive element MTJ is transitioned from a parallel state to an antiparallel state.

Vinitial is also a potential used in a write operation. Vinitial is a potential which is newly adopted in the present embodiment. Vinitial is an element unique to the present embodiment.

As explained above, the reference layer comprises a material or a structure in which the magnetization direction is difficult to reverse in comparison with the storage layer in the magnetoresistive element MTJ. However, the magnetization direction of the reference layer may be reversed at the time of a write operation because of manufacturing tolerances. If both of the magnetization directions of the storage and reference layers are reversed when the write data is 1 (AP-write), the magnetoresistive element MTJ is not transitioned to an antiparallel state after a write operation. Thus, correct data is not stored.

Vinitial is a potential used to return the magnetization direction of the reference layer when the magnetization of the reference layer has been reversed unintentionally as mentioned above (the details will be described later).

When the magnetization of the reference layer has been reversed in a write operation (AP-write), the read/write controller 21 performs an initialization operation for returning the magnetization direction of the reference layer (RL-initialization) after the write operation and before a read operation. Whether or not the magnetization of the reference layer has been reversed can be verified by, for example, a verify read operation (shown by the dotted arrow in FIG. 3).

It should be noted that an initialization operation may be performed in any case after the write operation and before a read operation regardless of whether or not the magnetization of the reference layer has been reversed. At this time, the value of write data may be confirmed in advance. If the write data is 1 (AP-write), an initialization operation may be performed.

In an initialization operation, the potential selector 22 selects Vinitial based on a select signal SEL from the read/write controller 21.

Vread/write/initial is set to Vinitial. Input signal Dw is set to 0 (low level). Input signal bDw is set to 1 (high level). Thus, Vinitial is applied to bit line BL. Vss is applied to bit line bBL. In this manner, an initialization current from bit line BL to bit line bBL flows in the magnetoresistive element MTJ. The magnetization direction of the reference layer is reversed.

In an initialization operation, to prevent the magnetization reversal of the storage layer, the value of Vinitial needs to be less than that of Vap-p.

Vread is a potential used in a read operation. Vread is a potential used to read the state of the resistance of the magnetoresistive element MTJ (specifically, an antiparallel state or a parallel state), in other words, to read the data stored in the magnetoresistive element MTJ.

The value of Vread needs to be less than that of Vap-p and that of Vp-ap to prevent the magnetization reversal of the storage layer at the time of a read operation. The value of Vread may be different from or the same as that of Vinitial. If the value of Vread is different from that of Vinitial, for example, the value of Vread is less than that of Vinitial. This is because when the value of Vread is greater than that of Vinitial, Vinitial can be replaced by Vread (Vinitial can be omitted). Similarly, if the value of Vread is the same as that of Vinitial, Vinitial can be replaced by Vread, and thus, Vread may serve as Vinitial.

In a read operation, the potential selector 22 selects Vread based on a select signal SEL from the read/write controller 21. Vread/write/initial is set to Vread. Input signal Dw is set to 0 (low level). Input signal bDw is set to 1 (high level). Thus, Vread is applied to bit line BL. Vss is applied to bit line bBL. In this manner, a read current from bit line BL to bit line bBL flows in the magnetoresistive element MTJ. The state of the resistance of the magnetoresistive element MTJ is read.

The read circuit 26 is connected to a pair of bit lines BL and bBL via a switch circuit 27. The read circuit 26 comprises, for example, two N-channel transistors (FET) N2 and N3. In a read operation and a verify read operation, a read-enable signal RE is changed from a low level to a high level. Thus, the read circuit 26 is electrically connected to bit lines BL and bBL.

Figure 6:
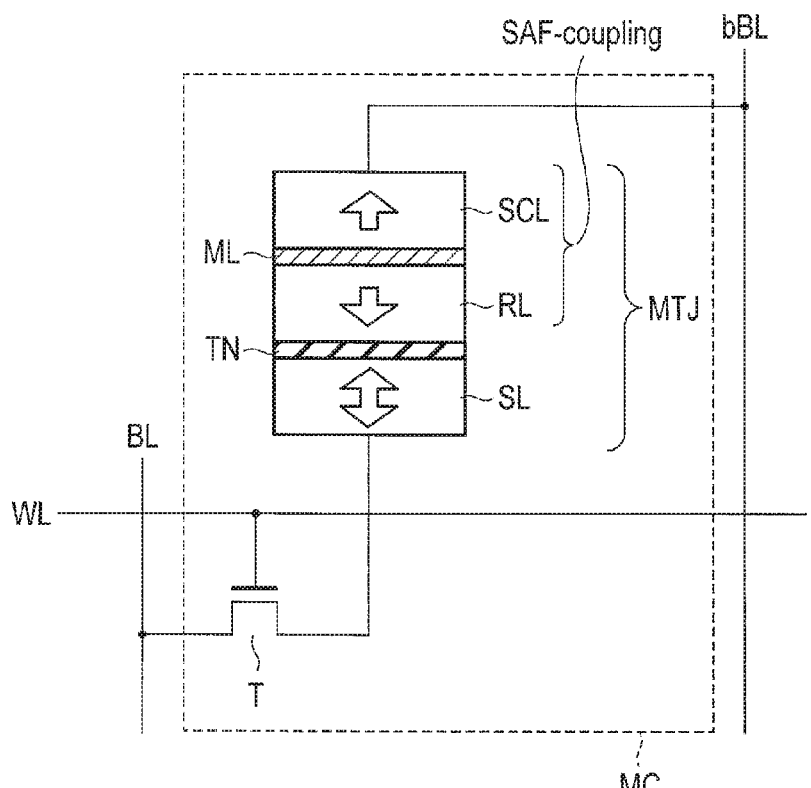
FIG. 6 shows an example of a memory cell.

FIG. 6 shows an example of a memory cell.

The memory cell MC corresponds to the memory cell MC shown in FIG. 3.

The memory cell MC comprises a select transistor T and a magnetoresistive element MTJ connected in series between a pair of bit lines BL and bBL. The magnetoresistive element MTJ comprises a storage layer (magnetic layer) SL, a reference layer (magnetic layer) RL, and a nonmagnetic layer (tunnel barrier layer) TN between the storage and reference layers. The reference layer RL comprises a material or a structure in which the magnetization direction is difficult to reverse in comparison with the storage layer SL. The storage layer SL comprises a magnetic material such as CoFeB or FeB. The reference layer RL comprises a magnetic material such as CoPt, CoNi or CoPd. The nonmagnetic layer TN comprises an insulating layer formed of MgO, etc.

The magnetoresistive element MTJ further comprises a magnetic layer SCL which is synthetic-antiferromagnetic-coupled (SAF-coupled) with the reference layer RL. Between the reference layer RL and the magnetic layer SCL, a nonmagnetic layer (for example, a metal layer) ML may be provided as shown in this example, or may be omitted.

SAF-coupling indicates a state in which the magnetic moment of two magnetic layers (the reference layer RL and the magnetic layer SCL) is the most stable when the magnetization directions of the two magnetic layers are antiparallel (opposite).

The magnetic layer SCL may function as a shift-cancelling layer which cancels an effect of shift of the hysteresis curve of magnetization reversal of the storage layer SL due to the stray magnetic field from the reference layer RL. In a manner similar to that of the reference layer RL, the magnetic layer SCL comprises a magnetic material such as CoPt, CoNi or CoPd.

The storage layer SL, the reference layer RL and the magnetic layer SCL have a magnetization in a perpendicular direction in which they are stacked, in other words, a perpendicular magnetization. The storage layer SL, the reference layer RL and the magnetic layer SCL may have a magnetization in an in-plane direction perpendicular to the direction in which they are stacked, in other words, an in-plane magnetization.

The hysteresis curves of magnetization reversal of the storage layer SL and the reference layer RL of the magnetoresistive element MTJ having the above structure are, for example, shown in FIG. 7 (normal mode).

In FIG. 7, the horizontal axis indicates a write potential. The left side of 0 V shows the potential applied to the storage layer SL when the magnetic layer SCL is 0 V. The right side of 0 V shows the potential applied to the magnetic layer SCL when the storage layer SL is 0 V.

The left vertical axis indicates the probability of downward magnetization, specifically, the probability that the magnetization direction of the storage layer SL or the reference layer RL turns downward. The right vertical axis indicates the probability of upward magnetization, specifically, the probability that the magnetization direction of the storage layer SL or the reference layer RL turns upward. The downward magnetization indicates that the magnetization direction of the storage layer SL or the reference layer RL is toward a side opposite to the magnetic layer SCL side in FIG. 6. The upward magnetization indicates that the magnetization direction of the storage layer SL or the reference layer RL is toward the magnetic layer SCL side in FIG. 6.

As is clear from the above figure, the hysteresis curve of the magnetization direction of the storage layer SL is close to the 0 V line in comparison with the hysteresis curve of magnetization reversal of the reference layer RL. Thus, the potential in which the magnetization of the storage layer SL is reversed is less than that in which the magnetization of the reference layer RL is reversed.

When Vap-p located between these potentials is applied to the storage layer SL of the magnetoresistive element MTJ, the probability that the magnetization direction of the storage layer SL turns downward is 100%, and further, the probability that the magnetization direction of the reference layer RL turns downward is 0%. Thus, a P-write is performed. The state of the resistance of the magnetoresistive element MTJ is changed from an antiparallel state to a parallel state.

When Vp-ap located between the potentials is applied to the magnetic layer SCL of the magnetoresistive element MTJ, the probability that the magnetization direction of the storage layer SL turns upward is 100%, and further, the probability that the magnetization direction of the reference layer RL turns upward is 0%. Thus, an AP-write is performed. The state of the resistance of the magnetoresistive element MTJ is changed from a parallel state to an antiparallel state.

Note that each of the potential in which the magnetization of the storage layer SL is reversed and the potential in which the magnetization of the reference layer RL is reversed exhibits a distribution because of manufacturing tolerances, etc.

Because of the above factor, for example, as shown in FIG. 8 (failure mode), the Vp-ap line may intersect with the hysteresis curve of magnetization reversal of the reference layer RL (specifically, the portion of change from 0 to 100% in the right axis). In this case, for example, when Vp-ap is applied to the magnetic layer SCL of the magnetoresistive element MTJ, the magnetization direction of the reference layer RL is reversed based on a constant probability P (0%<P≤100%).

Thus, both of the magnetization directions of the storage and reference layers SL and RL of the magnetoresistive element MTJ may be upward after an AP-write. This state is equivalent to a parallel state. Specifically, the state of the resistance of the magnetoresistive element MTJ is a parallel state (0-state) although an AP-write (1-writing) has been performed.

Figure 9:
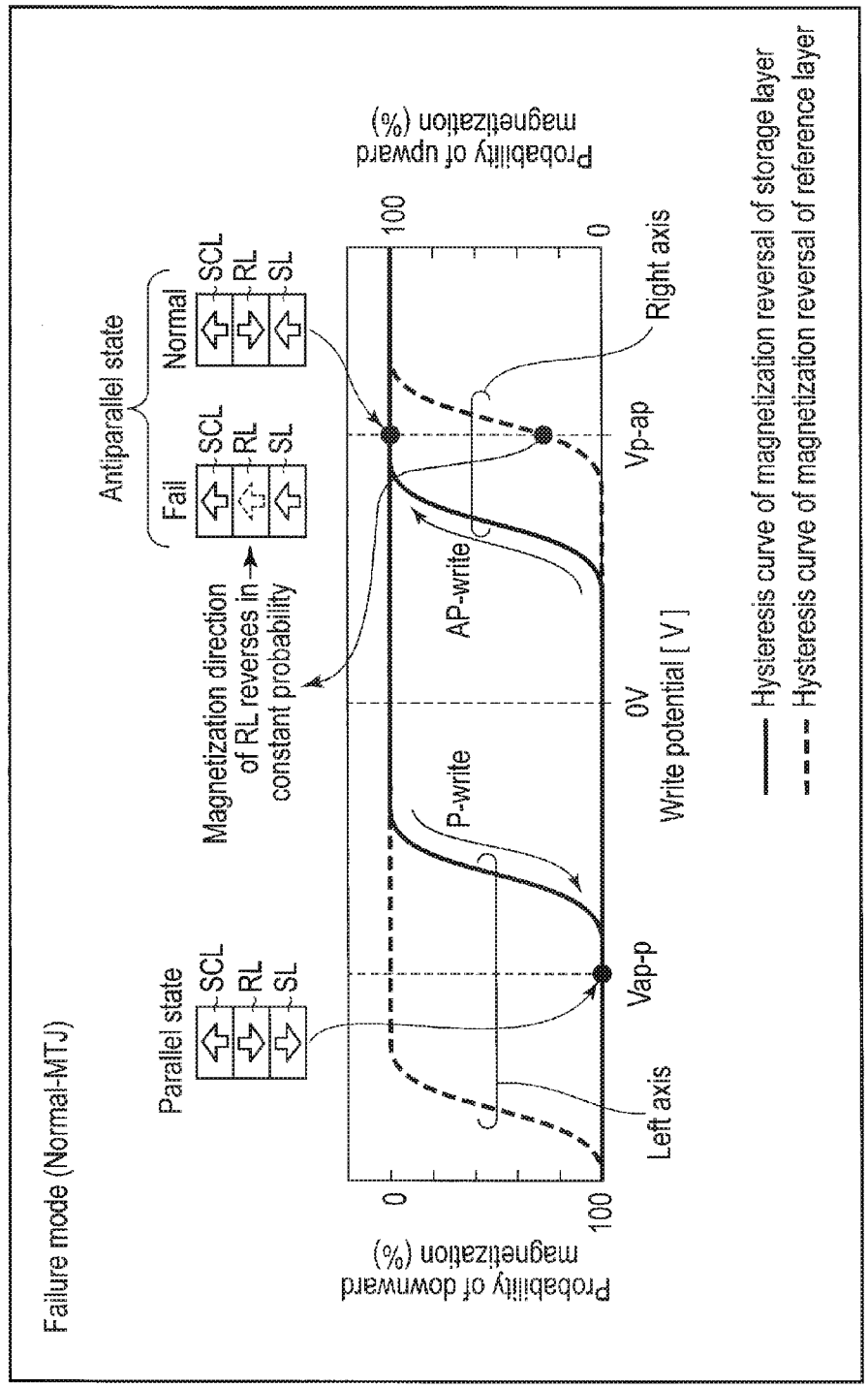

In a normal magnetoresistive element MTJ, if the above failure mode has been generated, the magnetoresistive element MTJ becomes a hardware defective element. The element cannot be recovered. In a normal magnetoresistive element MTJ, as shown in FIG. 9 (failure mode), the hysteresis curve of the magnetization direction of the storage layer SL is always close to the 0 V line in comparison with the hysteresis curve of magnetization reversal of the reference layer RL.

Note that a normal magnetoresistive element MTJ indicates a case where SAF-coupling between the reference layer RL and the magnetic layer SCL is not present, or a case where the magnetic layer SCL and the nonmagnetic layer ML are omitted, in the magnetoresistive element MTJ shown in FIG. 6.

As shown in FIG. 8 (failure mode), in the magnetoresistive element MTJ in which the reference layer RL is SAF-coupled with the magnetic layer SCL, when both of the magnetization directions of the storage and reference layers SL and RL of the magnetoresistive element MTJ are upward after an AP-write, the hysteresis curve of magnetization reversal of the reference layer RL is changed by an SAF-coupling effect.

Specifically, curve X (a case of failure) indicating the probability that the magnetization direction of the reference layer RL turns downward (in the left vertical axis) is shifted to a position close to the 0 V line in comparison with a case of normal. Thus, curve X indicating the probability that the magnetization direction of the reference layer RL turns downward (in the left vertical axis) is close to the 0 V line in comparison with curve Y indicating the probability that the magnetization direction of the storage layer SL turns downward (in the left vertical axis).

It is considered that the above state is generated by an effect of SAF-coupling between the reference layer RL and the magnetic layer SCL. The magnetic moment of the reference layer RL and the magnetic layer SCL is the most stable when the magnetization directions of the layers are antiparallel (opposite). When the magnetization directions of the reference and magnetic layers RL and SCL become the same as each other by the failure mode of FIG. 8, a force to return the magnetization direction of the reference layer RL is applied. In this manner, curve X gets close to the 0 V line in comparison with curve Y.

In general, in a magnetoresistive element MTJ in which the magnetization direction of the reference layer RL has been reversed, the magnetization direction of the reference layer RL is returned spontaneously by an effect of the above SAF-coupling when the voltage applied to the magnetoresistive element MTJ is set to zero after a write operation. However, the effect of SAF-coupling varies because of manufacturing tolerances, etc. Thus, a magnetoresistive element MTJ in which the magnetization directions of the reference layer RL and the magnetic layer SCL are the same remains based on a constant probability even when the voltage applied to the magnetoresistive element MTJ is set to zero after a write operation.

Figure 10:
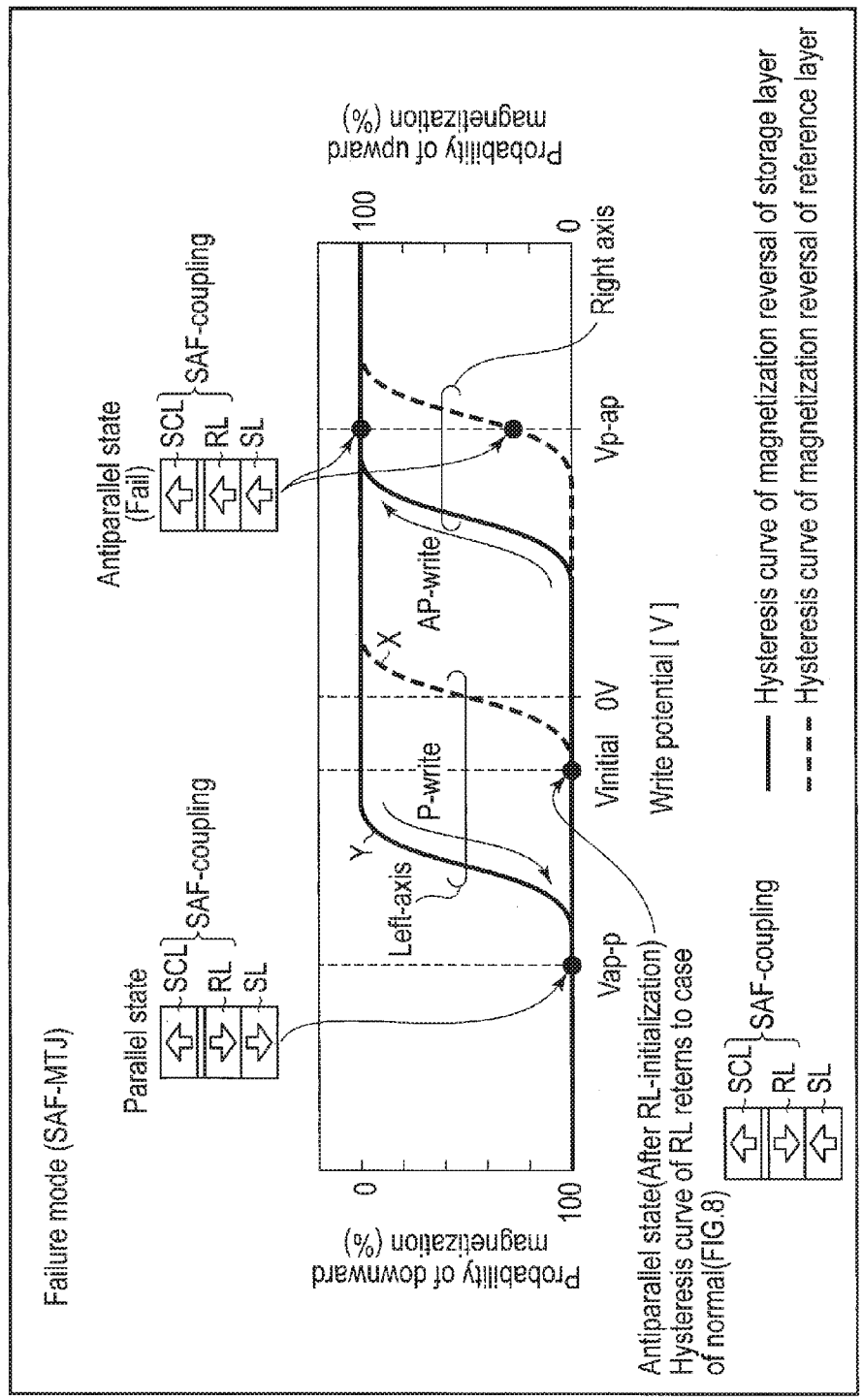

In consideration of the above problem, for example, as shown in FIG. 10 (failure mode), Vinitial is set between two curves X and Y. Further, an initialization operation (RL-initialization) for applying Vinitial to the magnetoresistive element MTJ is performed after a write operation (AP-write). In this manner, only the magnetization direction of the reference layer RL can be reversed. The magnetization direction of the reference layer RL can be initialized (turned downward). It should be noted that Vinitial is not set to zero and is set to a value which allows the magnetization direction of the reference layer RL to 100% turn downward.

With the above structure, even when the failure mode of FIG. 8 has occurred, the magnetoresistive element MTJ does not become a hardware defective element. The magnetoresistive element MTJ can be recovered by the initialization operation (RL-initialization) shown in FIG. 10.

For example, even when the magnetization directions of all of the storage layer SL, the reference layer RL and the magnetic layer SCL have turned upward by an AP-write, only the magnetization direction of the reference layer RL can be changed to a downward direction by applying an initialization operation (RL-initialization) using Vinitial. In this way, the state of the magnetoresistive element MTJ can be returned to a normal antiparallel state.

Now, the relationship between Vinitial and Vread is explained.

When a failure mode occurs in an AP-write, Vinitial is set to the P-write side (left side) of the 0 V line. The polarity of the voltage which is applied to the magnetoresistive element MTJ in a P-write and an RL-initialization is opposite to that of the voltage which is applied to the magnetoresistive element MTJ in an AP-write.

In this case, Vread can be selected from the following patterns.

Figure 11:
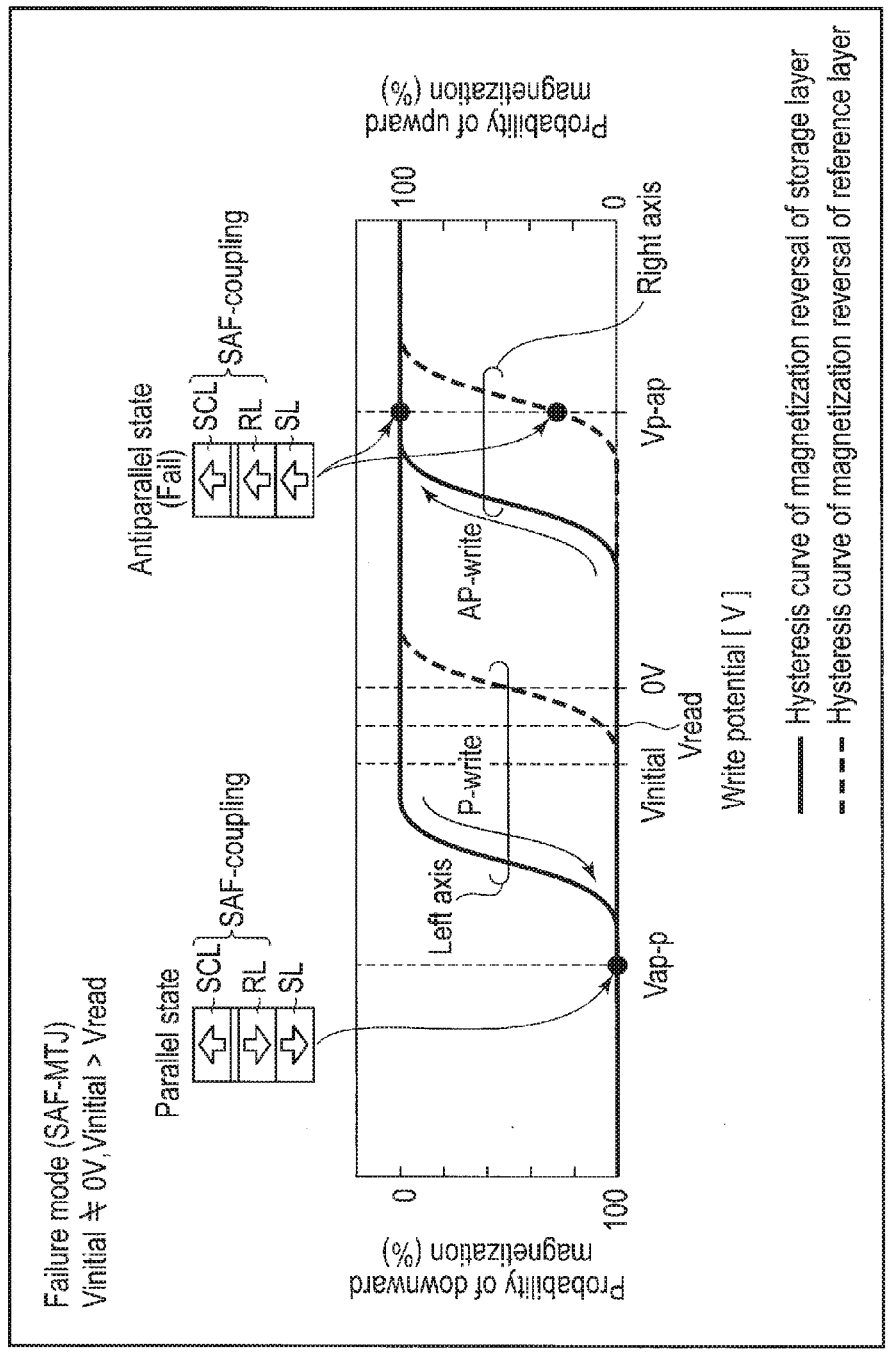

For example, as shown in FIG. 11, Vread can be set to the P-write side (left side) of the 0 V line in a manner similar to that of Vinitial. The polarity of the voltage applied to the magnetoresistive element MTJ is the same in a P-write, an RL-initialization and a read operation. It should be noted that Vread is less than Vap-p and Vinitial.

Figure 12:
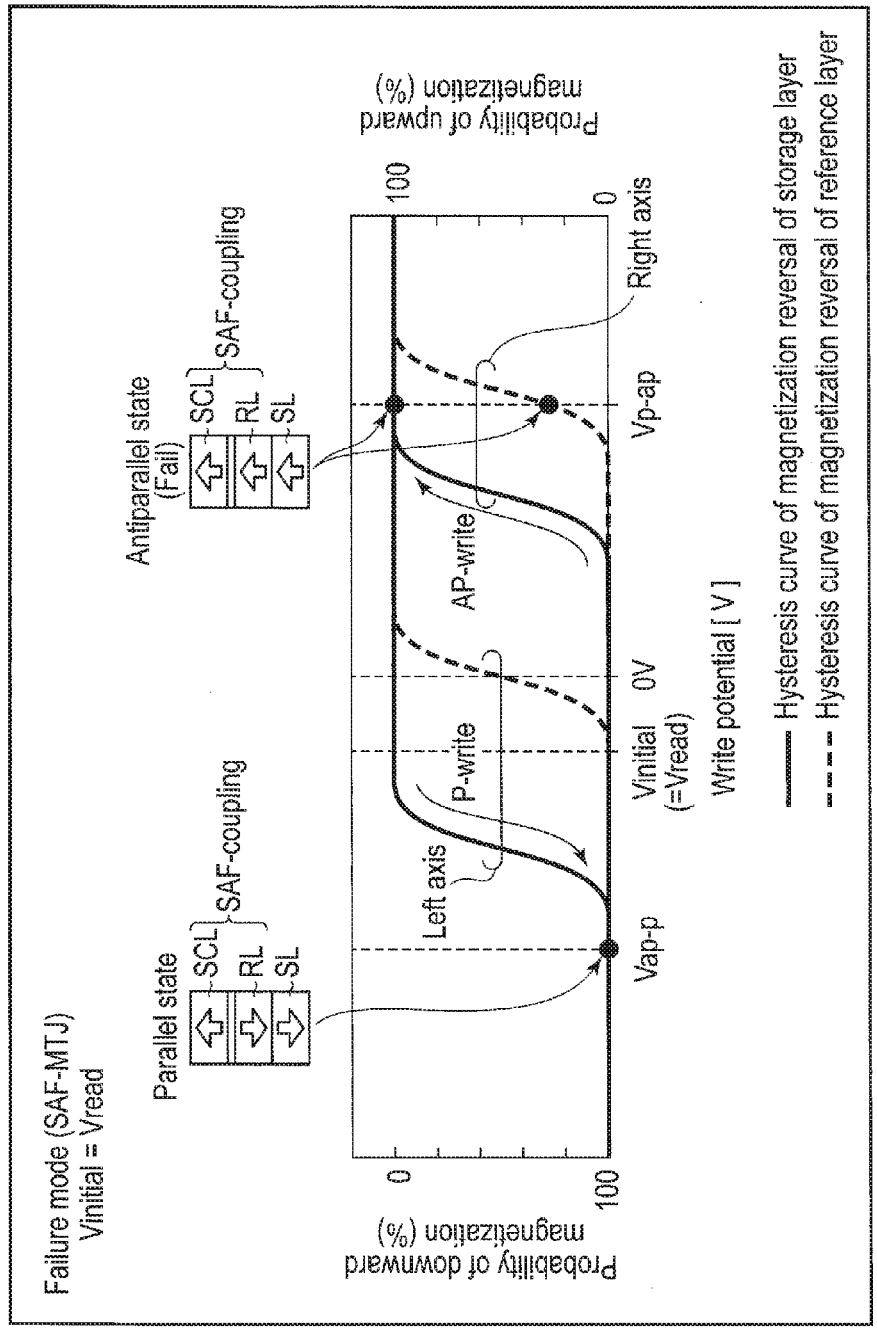

As shown in FIG. 12, Vread may be located on the P-write side (left side) of the 0 V line and equal to Vinitial. The polarity of the voltage applied to the magnetoresistive element MTJ is the same in a P-write, an RL-initialization and a read operation. In this case, Vread is used in place of Vinitial.

As shown in FIG. 13, Vread may be set to the AP-write side (right side) of the 0 V line. The polarity of the voltage which is applied to the magnetoresistive element MTJ in a P-write and an RL-initialization is different from that of the voltage which is applied to the magnetoresistive element MTJ in an AP-write and a read operation. Note that Vread is less than Vp-ap.

The above patterns are examples in which a failure mode occurs in an AP-write. This is because the margin between the potential in which the magnetization direction of the storage layer SL turns upward and the potential in which the magnetization direction of the reference layer RL turns upward is generally small in terms of the design of the magnetic memory. Note that, even when a failure mode has occurred in a P-write, recovery may be performed based on the same principle of the recovery from a failure mode in an AP-write.

FIG. 14 shows the first example of a write operation.

The first example is a flowchart in which the initialization operation of the reference layer is performed after a write operation and before a read operation regardless of the value of write data.

In the first example, there is no need to determine the value of write data or perform a verify read operation for verifying whether or not the magnetization of the reference layer has been reversed. Therefore, processing in the read/write controller can be simplified.

After accepting a write command, a write operation is performed (steps ST11 and ST12). After the write operation, the initialization operation of the reference layer (RL-initialization) is performed (step ST13). After the initialization operation of the reference layer, it is determined that the write operation has been performed correctly.

When Vread is less than Vinitial, or when the polarity of Vread is different from that of Vinitial, the initialization operation of the reference layer is performed using Vinitial. When Vread is equal to Vinitial, the initialization operation of the reference layer using Vinitial may be replaced by the initialization operation (dummy read operation) of the reference layer using Vread.

Figure 15:
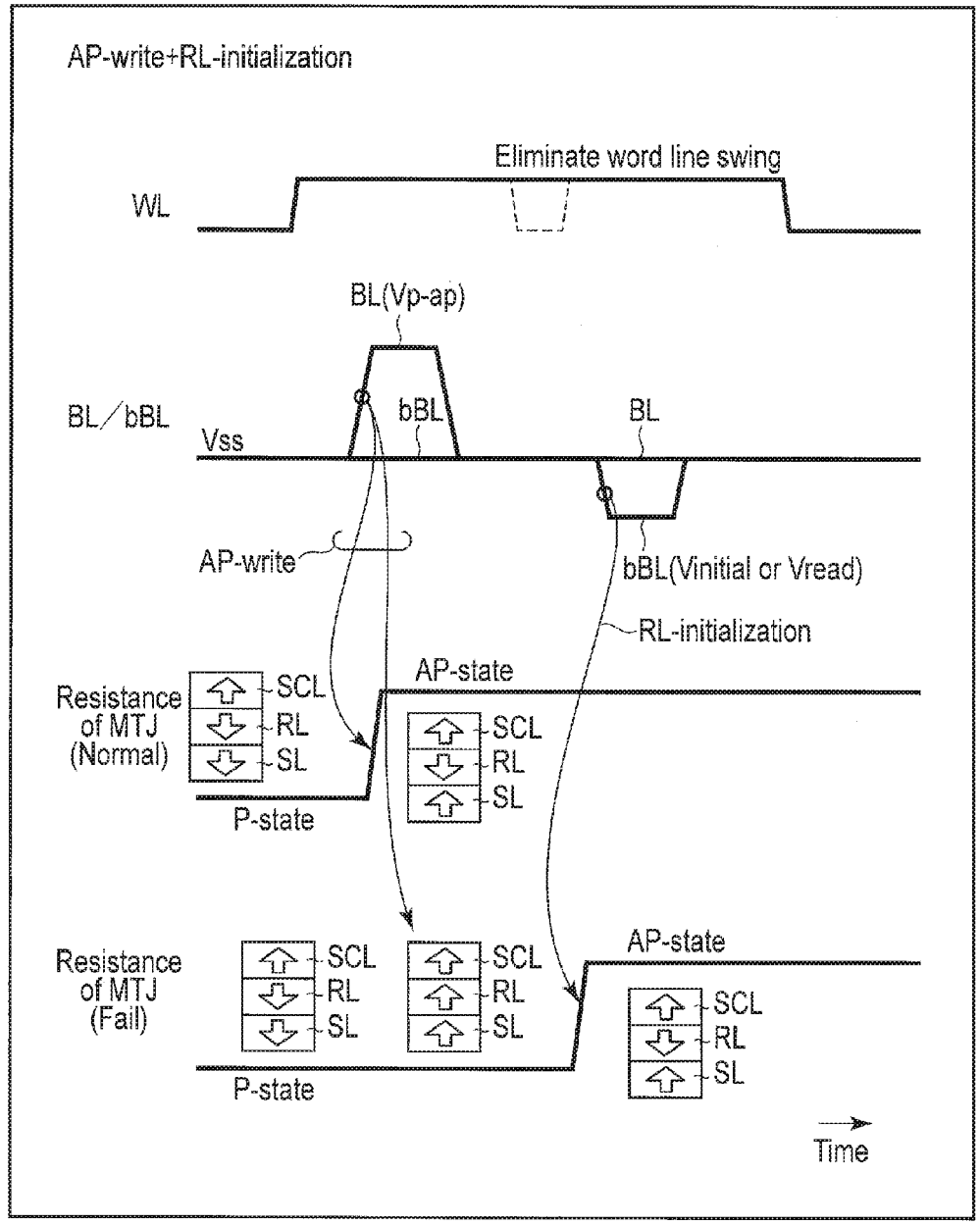
FIG. 15 shows the relationship between an AP-write and an RL-initialization.

FIG. 15 shows the relationship between the potential of the selected word line WL and the potential of the selected pair of bit lines BL and bBL in the first example of a write operation. The selected word line WL and the selected pair of bit lines BL and bBL refer to the word line and the pair of bit lines connected to the memory cell to which write data is written.

In the first example of a write operation, a write operation and an initialization operation are performed continuously. In this case, for example, a write operation and an initialization operation are preferably performed without changing the potential of the selected word line WL, in other words, while maintaining the state (high level) in which the word line WL is selected. In this manner, it is possible to eliminate the swing of the word line WL and contribute to the reduction in consumed power of the memory system.

When the write operation is an AP-write, Vp-ap is applied to bit line BL, and Vss is applied to bit line bBL. In a normal write operation (normal), the magnetoresistive element MTJ is transitioned from a parallel state to an antiparallel state. However, in a write operation in which the magnetization direction of the reference layer is reversed (failure), the magnetoresistive element MTJ maintains its parallel state substantially.

To solve this problem, after the write operation, the initialization operation of the reference layer is performed. In the initialization operation of the reference layer, Vinitial (Vread in a dummy read operation) is applied to bit line bBL, and Vss is applied to bit line BL. Thus, the magnetization direction of the reference layer of the magnetoresistive element MTJ is returned. The magnetoresistive element MTJ is transitioned from a parallel state to an antiparallel state correctly.

Figure 16:
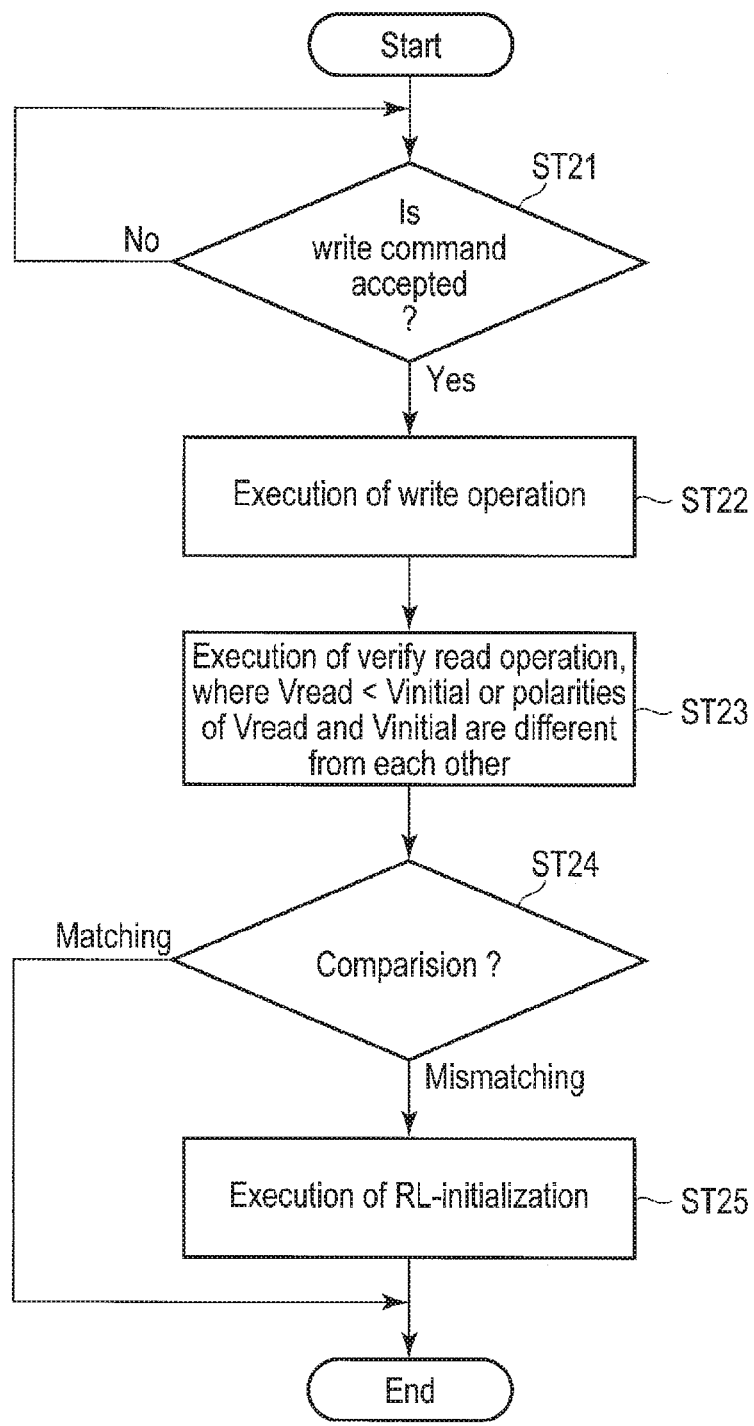
FIG. 16 shows the second example of a write operation.

FIG. 16 shows the second example of a write operation.

The second example is a flowchart in which a verify read operation is performed after a write operation to verify whether or not the magnetization of the reference layer has been reversed, and further, the initialization operation of the reference layer is performed after the write operation and before a read operation when the magnetization reversal of the reference layer has been confirmed.

In the second example, a verify read operation is performed. With this operation, it is possible to appropriately perform the initialization operation of the reference layer of a memory cell in which the magnetization of the reference layer has been reversed.

After accepting a write command, a write operation is performed (steps ST21 and ST22). After the write operation, a verify read operation is performed to verify whether or not the magnetization of the reference layer has been reversed (step ST23). Here, the read potential Vread used for the verify read operation is less than Vinitial, or has a polarity different from that of Vinitial.

Subsequently, write data is compared with read data (step ST24). If they are matched, it is determined that the write operation has been performed correctly.

If they are mismatched, it is determined that the magnetization of the reference layer has been reversed. Thus, the initialization operation of the reference layer (RL-initialization) is performed (step ST25). After the initialization operation of the reference layer, it is determined that the write operation has been performed correctly.

FIG. 17 shows the relationship between the potential of the selected word line WL and the potential of the selected pair of bit lines BL and bBL in the second example of a write operation.

In the second example of a write operation, a write operation, a verify read operation and an initialization operation are performed continuously. In this case, for example, a write operation, a verify read operation and an initialization operation are preferably performed without changing the potential of the selected word line WL, in other words, while maintaining the state (high level) in which the word line WL is selected. Thus, it is possible to eliminate the swing of the word line WL and contribute to the reduction in consumed power of the memory system in a manner similar to that of the first example.

When the write operation is an AP-write, Vp-ap is applied to bit line BL, and Vss is applied to bit line bBL. In a normal write operation (normal), the magnetoresistive element MTJ is transitioned from a parallel state to an antiparallel state. However, in a write operation in which the magnetization direction of the reference layer is reversed (failure), the magnetoresistive element MTJ maintains its parallel state substantially.

To solve this problem, a verify read operation is performed subsequent to the write operation. In the verify read operation, for example, Vread is applied to bit line bBL, and Vss is applied to bit line BL. In this way, the data of the memory cell is read. The read data from the memory cell is compared with write data. If they are mismatched, it is determined that the magnetization direction of the reference layer has been reversed.

If it is determined that the magnetization direction of the reference layer has been reversed, the initialization operation of the reference layer is performed. In the initialization operation of the reference layer, Vinitial is applied to bit line bBL, and Vss is applied to bit line BL. Thus, the magnetization direction of the reference layer of the magnetoresistive element MTJ is returned. The magnetoresistive element MTJ is transitioned from a parallel state to an antiparallel state correctly.

Figure 18:
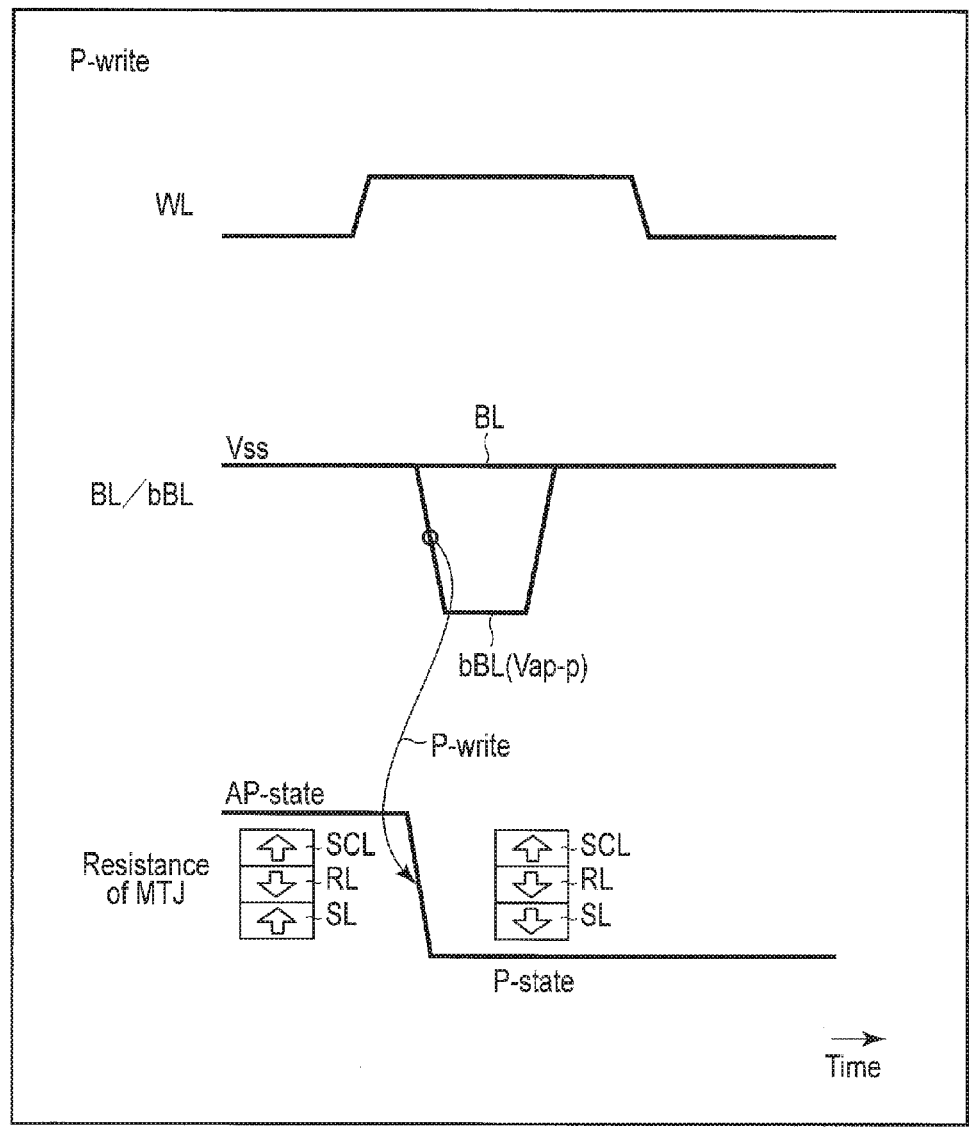
FIG. 18 shows an example of a P-write.

As shown in FIG. 18, when the write operation is a P-write in the above first and second examples of write operations, the initialization operation of the reference layer may not be performed in any case. In a P-write, the possibility that the magnetization direction of the reference layer is reversed is small in comparison with an AP-write.

FIG. 19 shows the third example of a write operation.

In the third example, the value of write data is checked in advance before a write operation. The processing of the subsequent write operation is changed based on the value of write data.

After accepting a write command, the value of write data is checked (steps ST31 and ST32). If the write data is 0, a P-write is performed (step ST33_0). In this case, the write operation is terminated without performing the initialization operation of the reference layer. If the write data is 1, an AP-write is performed (step ST33_1). In this case, the initialization operation of the reference layer (RL-initialization) is performed after the write operation (step ST34). After the initialization operation of the reference layer, it is determined that the write operation has been performed correctly.

In the third example, in a P-write, the initialization operation of the reference layer can be omitted. Thus, the write speed of P-write can be improved. In an AP-write, correct data can be stored by the initialization operation of the reference layer.

FIG. 20 shows the fourth example of a write operation.

The fourth example is a combination of the second and third examples.

In the fourth example, the value of write data is checked in advance before a write operation. If the write data is 1 (AP-write), a verify read operation is performed after the write operation to verify whether or not the magnetization of the reference layer has been reversed. When the magnetization reversal of the reference layer has been confirmed, the initialization operation of the reference layer is performed.

After accepting a write command, the value of write data is checked (steps ST41 and ST42). If the write data is 0, a P-write is performed (step ST43_0). In this case, the write operation is terminated without performing the initialization operation of the reference layer.

If the write data is 1, an AP-write is performed (step ST43_1). In this case, after the AP-write, a verify read operation is performed to verify whether or not the magnetization of the reference layer has been reversed (step ST44). Subsequently, write data is compared with read data (step ST45).

If they are matched, it is determined that the write operation has been performed correctly. In this case, the write operation is terminated without performing the initialization operation of the reference layer.

If they are mismatched, it is determined that the magnetization of the reference layer has been reversed. Thus, the initialization operation of the reference layer is performed (step ST46). After the initialization operation of the reference layer, it is determined that the write operation has been performed correctly.

In the fourth example, in a manner similar to that of the third example, the write speed of P-write can be improved since the initialization operation of the reference layer can be omitted in a P-write. In the fourth example, in an AP-write, in a manner similar to that of the second example, a verify read operation is performed to verify whether or not the magnetization of the reference layer has been reversed. When the magnetization reversal of the reference layer has been confirmed, the initialization operation of the reference layer is performed. Thus, correct data can be stored.

FIG. 21 shows the relationship between a write operation and a read operation.

This example shows a case where a read operation is performed after an AP-write, and a case where a read operation is performed after a P-write.

For example, a verify read operation and the initialization operation of the reference layer (RL-initialization) are performed after an AP-write and before a read operation. In this way, write data 1 is written to the memory cell correctly. The magnetoresistive element of the memory cell is transitioned to an AP-state correctly. Thus, correct data can be read from the memory cell in a read operation after the AP-write.

Write data 0 is written to the memory cell correctly by a P-write. The magnetoresistive element of the memory cell is transitioned to a P-state correctly by the P-write. Thus, correct data can be read from the memory cell in a read operation after the P-write.

CONCLUSION

As explained above, in the above embodiments, it is possible to avoid a hardware defect in which the magnetization direction of a reference layer is reversed at the time of a write operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
    a first magnetic layer;
    a second magnetic layer;
    a nonmagnetic layer between the first and second magnetic layers;
    a third magnetic layer synthetic-antiferromagnetic-coupled with the second magnetic layer;
    a first conductive line connected to the first magnetic layer;
    a second conductive line connected to the third magnetic layer; and
    a controller controlling a read operation and a write operation, the write operation including a first operation, a second operation and a third operation, a first potential of the first conductive line being larger than a second potential of the second conductive line in the first operation, a third potential of the second conductive line being larger than a fourth potential of the first conductive line in the second operation, a fifth potential of the first conductive line being larger than a sixth potential of the second conductive line in the third operation, a first difference between the fifth and sixth potentials being smaller than a second difference between the first and second potentials, and the third operation being executed after the second operation and before the read operation.

2. The memory of claim 1, further comprising:
    a selector selecting one of the first, third and fifth potentials based on a select signal from the controller.

3. The memory of claim 1,
    wherein a seventh potential of the first conductive line is larger than a eighth potential of the second conductive line in the read operation.

4. The memory of claim 3,
wherein a third difference between the seventh and eighth potentials is smaller than the first difference and is smaller than the second difference.

5. The memory of claim 3,
wherein a third difference between the seventh and eighth potentials is equal to the second difference.

6. The memory of claim 1,
wherein the first operation is an operation which changes magnetization directions of the first and second magnetic layers in a parallel state by a magnetization reversal of the first magnetic layer.

7. The memory of claim 1,
wherein the second operation is an operation which changes magnetization directions of the first and second magnetic layers in an antiparallel state by a magnetization reversal of the first magnetic layer.

8. The memory of claim 1,
wherein the third operation is an operation which returns a magnetization direction of the second magnetic layer when a magnetization reversal of the second magnetic layer occurs in the second operation.

9. The memory of claim 1,
wherein the second difference is smaller than a difference of potential for a magnetization reversal of the first magnetic layer.

10. The memory of claim 1,
wherein the third operation is also executed after the first operation and before the read operation.

11. The memory of claim 1,
wherein the controller controls a verify read which verifies whether a magnetization reversal of the second magnetic layer occurs in the second operation, and executes the third operation when the magnetization reversal of the second magnetic layer generates in the second operation.

12. The memory of claim 1, further comprising:
a nonmagnetic layer between the second and third magnetic layers.

13. The memory of claim 1,
wherein the first, second and third magnetic layers have magnetization directions respectively in a direction in which the first, second and third magnetic layers are stacked.

14. The memory of claim 1, further comprising:
a semiconductor substrate;
a transistor on the semiconductor substrate, the transistor having a control terminal, a first current terminal, and a second current terminal; and
a word line connected to the control terminal,
wherein the first current terminal is connected to the first magnetic layer, the second current terminal is connected to the first conductive line, the second magnetic layer provided on the first magnetic layer, and the third magnetic layer is provided on the second magnetic layer.

15. The memory of claim 14,
wherein the controller executes the second and third operations continuously in a state of selecting the word line.

16. The memory of claim 15,
wherein the controller unchanges a potential of the word line while the second and third operations are executed.

17. A method of writing first or second data to a magnetoresistive element, the magnetoresistive element comprising a first magnetic layer, a second magnetic layer, a nonmagnetic layer between the first and second magnetic layers, and a third magnetic layer synthetic-antiferromagnetic-coupled with the second magnetic layer, wherein the first magnetic layer is connected to a first conductive line, and the third magnetic layer is connected to a second conductive line,
the method comprising:
writing the first data to the magnetoresistive element by applying a first potential larger than a potential applied to the second conductive line to the first conductive line;
writing the second data to the magnetoresistive element by applying a second potential larger than a potential applied to the first conductive line to the second conductive line; and
applying a third potential larger than a potential applied to the second conductive line and smaller than the first potential to the first conductive line after writing the second data and before a read operation.

18. The method of claim 17,
wherein the magnetization directions of the first and second magnetic layers change in a parallel state by applying the first potential to the first conductive line.

19. The method of claim 17,
wherein the magnetization directions of the first and second magnetic layers change in an antiparallel state by applying the second potential to the second conductive line.

20. The method of claim 17,
wherein a magnetization direction of the second magnetic layer is returned by applying the third potential to the first conductive line when a magnetization reversal of the second magnetic layer occurs by applying the second potential to the second conductive line.

* * * * *